United States Patent
Padhi et al.

(10) Patent No.: US 8,282,734 B2
(45) Date of Patent: Oct. 9, 2012

(54) METHODS TO IMPROVE THE IN-FILM DEFECTIVITY OF PECVD AMORPHOUS CARBON FILMS

(75) Inventors: Deenesh Padhi, Sunnyvale, CA (US); Chiu Chan, Foster City, CA (US); Sudha Rathi, San Jose, CA (US); Ganesh Balasubramanian, Sunnyvale, CA (US); Jianhua Zhou, San Jose, CA (US); Karthik Janakiraman, San Jose, CA (US); Martin J. Seamons, San Jose, CA (US); Visweswaren Sivaramakrishnan, Cupertino, CA (US); Derek R. Witty, Fremont, CA (US); Hichem M'Saad, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 811 days.

(21) Appl. No.: 12/255,638

(22) Filed: Oct. 21, 2008

(65) Prior Publication Data

US 2009/0044753 A1    Feb. 19, 2009

Related U.S. Application Data

(62) Division of application No. 11/680,278, filed on Feb. 28, 2007, now Pat. No. 7,514,125.

(60) Provisional application No. 60/805,706, filed on Jun. 23, 2006.

(51) Int. Cl.
| | |
|---|---|
| *C23C 16/455* | (2006.01) |
| *C23C 16/30* | (2006.01) |
| *C23C 16/34* | (2006.01) |
| *C23C 16/32* | (2006.01) |
| *B05C 11/00* | (2006.01) |
| *C23F 1/00* | (2006.01) |
| *H01L 21/306* | (2006.01) |
| *C23C 16/06* | (2006.01) |
| *C23C 16/22* | (2006.01) |

(52) U.S. Cl. ............ 118/715; 118/45; 156/345.34
(58) Field of Classification Search ........... 118/723 E, 118/715, 45; 427/506, 520, 590, 255.394; 156/345.34

See application file for complete search history.

(56) References Cited

U.S. PATENT DOCUMENTS 4,142,004 A * 2/1979 Hauser et al. .............. 438/792
(Continued)

FOREIGN PATENT DOCUMENTS

JP    H03-240959    10/1991
(Continued)

OTHER PUBLICATIONS

Notice On The First Office Action mailed Jun. 9, 2010, in Chinese Patent Application 200780023174.8.

(Continued)

*Primary Examiner* — Rudy Zervigon
(74) *Attorney, Agent, or Firm* — Patterson & Sheridan, LLP

(57) ABSTRACT

An article having a protective coating for use in semiconductor applications and methods for making the same are provided. In certain embodiments, a method of coating an aluminum surface of an article utilized in a semiconductor processing chamber is provided. The method comprises providing a processing chamber; placing the article into the processing chamber; flowing a first gas comprising a carbon source into the processing chamber; flowing a second gas comprising a nitrogen source into the processing chamber; forming a plasma in the chamber; and depositing a coating material on the aluminum surface. In certain embodiments, the coating material comprises an amorphous carbon nitrogen containing layer. In certain embodiments, the article comprises a showerhead configured to deliver a gas to the processing chamber.

8 Claims, 7 Drawing Sheets

U.S. PATENT DOCUMENTS

| | | | | |
|---|---|---|---|---|
| 4,196,233 A * | 4/1980 | Bitzer et al. | | 427/249.1 |
| 4,690,793 A * | 9/1987 | Okamura et al. | | 376/136 |
| 4,871,401 A * | 10/1989 | Arai et al. | | 148/209 |
| 5,052,339 A * | 10/1991 | Vakerlis et al. | | 118/723 E |
| 5,085,727 A | 2/1992 | Steger | | |
| 5,200,232 A * | 4/1993 | Tappan et al. | | 427/569 |
| 5,569,356 A * | 10/1996 | Lenz et al. | | 438/729 |
| 5,650,201 A * | 7/1997 | Tompa | | 427/523 |
| 5,691,237 A | 11/1997 | Ohkura et al. | | |
| 5,725,913 A * | 3/1998 | Wong et al. | | 427/530 |
| 5,788,799 A * | 8/1998 | Steger et al. | | 156/345.37 |
| 5,855,681 A | 1/1999 | Maydan et al. | | |
| 5,968,377 A * | 10/1999 | Yuasa et al. | | 219/121.41 |
| 6,033,979 A | 3/2000 | Endo | | |
| 6,114,258 A * | 9/2000 | Miner et al. | | 438/787 |
| 6,120,640 A * | 9/2000 | Shih et al. | | 156/345.1 |
| 6,492,038 B1 * | 12/2002 | Rigney et al. | | 428/627 |
| 6,506,254 B1 * | 1/2003 | Bosch et al. | | 118/715 |
| 6,514,565 B2 | 2/2003 | Dearnaley et al. | | |
| 6,533,910 B2 * | 3/2003 | O'Donnell et al. | | 204/298.31 |
| 6,565,661 B1 * | 5/2003 | Nguyen | | 118/715 |
| 6,632,325 B2 | 10/2003 | Lingampalli et al. | | |
| 6,699,375 B1 * | 3/2004 | Crocker | | 204/298.15 |
| 6,713,802 B1 | 3/2004 | Lee | | |
| 6,773,751 B2 * | 8/2004 | O'Donnell et al. | | 427/255.38 |
| 6,805,952 B2 * | 10/2004 | Chang et al. | | 428/334 |
| 6,808,747 B1 * | 10/2004 | Shih et al. | | 427/249.5 |
| 6,890,861 B1 * | 5/2005 | Bosch | | 438/706 |
| 6,902,628 B2 | 6/2005 | Wang et al. | | |
| 6,932,890 B2 | 8/2005 | Dai et al. | | |
| 7,045,072 B2 | 5/2006 | Tan et al. | | |
| 7,109,101 B1 | 9/2006 | Wright et al. | | |
| 7,119,032 B2 * | 10/2006 | Ji et al. | | 438/758 |
| 7,294,563 B2 * | 11/2007 | Al-Bayati et al. | | 438/513 |
| 7,642,180 B2 * | 1/2010 | Al-Bayati et al. | | 438/513 |
| 7,666,474 B2 * | 2/2010 | Li et al. | | 427/249.1 |
| 7,670,432 B2 * | 3/2010 | Li | | 118/715 |
| 7,740,705 B2 * | 6/2010 | Li | | 118/715 |
| 7,749,917 B1 * | 7/2010 | Rana et al. | | 438/765 |
| 7,794,546 B2 * | 9/2010 | Li | | 118/733 |
| 7,802,539 B2 * | 9/2010 | Bosch | | 118/723 E |
| 7,829,158 B2 * | 11/2010 | Ishizaka | | 427/576 |
| 8,021,743 B2 * | 9/2011 | Lin et al. | | 428/220 |
| 8,053,058 B2 * | 11/2011 | Harada et al. | | 428/141 |
| 2001/0049018 A1 | 12/2001 | Dearnaley et al. | | |
| 2002/0042192 A1 | 4/2002 | Tanaka et al. | | |
| 2002/0094378 A1 * | 7/2002 | O'Donnell et al. | | 427/249.1 |
| 2003/0148035 A1 | 8/2003 | Lingampalli | | |
| 2003/0207033 A1 * | 11/2003 | Yim et al. | | 427/255.37 |
| 2004/0033385 A1 * | 2/2004 | Kaushal et al. | | 428/627 |
| 2004/0137147 A1 * | 7/2004 | O'Donnell et al. | | 427/255.38 |
| 2004/0163484 A1 | 8/2004 | Maier et al. | | |
| 2005/0013761 A1 | 1/2005 | Kobayashi et al. | | |
| 2005/0074986 A1 | 4/2005 | Autryve et al. | | |
| 2005/0208217 A1 * | 9/2005 | Shinriki et al. | | 427/248.1 |
| 2005/0217577 A1 * | 10/2005 | Okuda et al. | | 118/715 |
| 2006/0040508 A1 * | 2/2006 | Ji et al. | | 438/758 |
| 2007/0157348 A1 | 7/2007 | Bae et al. | | |
| 2008/0006204 A1 * | 1/2008 | Rusinko et al. | | 118/715 |
| 2008/0016684 A1 * | 1/2008 | Olechnowicz et al. | | 29/748 |
| 2008/0081113 A1 * | 4/2008 | Clark | | 427/255.394 |
| 2009/0214787 A1 * | 8/2009 | Wei et al. | | 427/255.394 |
| 2010/0129994 A1 * | 5/2010 | Awad et al. | | 438/483 |

FOREIGN PATENT DOCUMENTS

KR  10-1999-0023841  3/1995

OTHER PUBLICATIONS

International Search Report and Written Opinion of the International Searching Authority, mailed Jan. 15, 2008. (PCT/US 07/71182).

Ji, H., et al., "Hydrophobic fluorinated carbon coatings on silicate glaze and aluminum". Thin Solid Films vol. 405, Issues 1-2, Feb. 22, 2002, pp. 104-108.

Malaczynski, G.W., et al., "Improved adhesion of diamond-like coatings using shallow carbon implantation". Journal of Materials Research, vol. 15, No. 3, Mar. 2000, pp. 590-592.

Notice to File a Response in Korean Patent Application No. 10-2007-0061722 dated Aug. 29, 2008.

Walter, K.C., et al., "Adherent diamond-like carbon coatings on metals via plasma source ion implantation". Surface and Coatings Technology, vol. 93, Issues 2-3, Sep. 1997, pp. 287-291.

Summary of Office Action for Taiwan Patent Application No. 96121923 dated Feb. 4, 2012.

\* cited by examiner

METHODS TO IMPROVE THE IN-FILM DEFECTIVITY OF PECVD AMORPHOUS CARBON FILMS

CROSS-REFERENCE TO RELATED APPLICATIONS

This application is a divisional of U.S. patent application Ser. No. 11/680,278 (APPM/011269), filed Feb. 28, 2007 now U.S. Pat. No. 7,514,125, which claims benefit of U.S. Provisional Patent Application Ser. No. 60/805,706 (APPM/011269L), filed Jun. 23, 2006, each of which is herein incorporated by reference.

BACKGROUND

1. Field

Embodiments of the invention as recited by the claims generally relate to an article having a protective coating for use in a semiconductor processing chamber and a method of making the same.

2. Description of the Related Art

Integrated circuits have evolved into complex devices that can include millions of transistors, capacitors and resistors on a single chip. The evolution of chip designs continually requires faster circuitry and greater circuit density that demand increasingly precise fabrication techniques and processes. One fabrication process frequently used is plasma enhanced chemical vapor deposition (PECVD).

PECVD is generally employed to deposit a thin film on a substrate or a semiconductor wafer. PECVD is generally accomplished by introducing a precursor gas or gases into a vacuum chamber. The precursor gas is typically directed through a showerhead typically fabricated from aluminum situated near the top of the chamber. Plasma is formed in the vacuum chamber. The precursor gas reacts with the plasma to deposit a thin layer of material on the surface of the substrate that is positioned on a substrate support. Purge gas is routed through holes in the support to the edge of the substrate to prevent deposition at the substrate's edge that may cause the substrate to adhere to the support. Deposition by-products produced during the reaction are pumped from the chamber through an exhaust system.

One material frequently formed on substrates using a PECVD process is amorphous carbon. Amorphous carbon is used as a hard mask material in semiconductor applications because of its chemical inertness, optical transparency, and good mechanical properties. Precursor gases that may be used to form amorphous carbon generally include a hydrocarbon, such as propylene, and hydrogen.

The etch selectivity of amorphous carbon films has been correlated to film density. Ion bombardment densification of amorphous carbon films is one method of increasing the etch selectivity of an amorphous carbon film, however, ion-bombardment induced film densification invariably leads to a proportional increase in the compressive film stress, both on the showerhead of the PECVD chamber and the substrate. Highly compressive carbon residues on the showerhead poorly adhere to the showerhead surfaces, producing flakes and particles during prolonged durations of deposition. The stray carbon residue builds on the showerhead and may become a source of contamination in the chamber. Eventually, the stray carbon residue may clog the holes in the showerhead that facilitate passage of the precursor gas therethrough thus necessitating removal and cleaning of the showerhead or possibly replacement.

Therefore, there is a need for an apparatus or method that reduces formation of loose carbon deposits on aluminum surfaces in semiconductor processing chambers.

SUMMARY

Embodiments of the present invention as recited by the claims generally provide an apparatus and method that reduces formation of loose carbon deposits on aluminum surfaces and reduces in-film particle formation in semiconductor processing chambers.

An article having a protective coating for use in semiconductor applications and methods for making the same are provided. In certain embodiments, a method of coating an aluminum surface of an article utilized in a semiconductor processing chamber is provided. The method comprises providing a processing chamber, placing the article into the processing chamber, flowing a first gas comprising a carbon source into the processing chamber, flowing a second gas comprising a nitrogen source into the processing chamber, and depositing a coating material on the aluminum surface. In certain embodiments, the coating material comprises a nitrogen containing amorphous carbon layer. In certain embodiments, the coated article is a showerhead configured to deliver a gas to the processing chamber.

In certain embodiments, a method of reducing contaminants in a layer deposited in a semiconductor processing chamber containing an aluminum surface is provided. The method comprises providing a semiconductor processing chamber, placing a substrate into the processing chamber, flowing a first gas comprising a carbon source into the processing chamber, flowing a second gas comprising a hydrogen source into the processing chamber, forming a plasma from an inert gas in the chamber, and depositing a layer on the substrate.

In certain embodiments, an article for use in a semiconductor processing chamber is provided. The article comprises a showerhead, a support pedestal, or a vacuum chamber body having an aluminum surface and a coating material comprising a nitrogen containing amorphous carbon material applied on the aluminum surface in a plasma enhanced chemical vapor deposition process.

In certain embodiments a showerhead having an aluminum surface coated with a nitrogen containing amorphous carbon material is provided. The nitrogen containing amorphous carbon material is applied to the showerhead by a method comprising flowing a first gas comprising a carbon source into the processing chamber, flowing a second gas comprising a nitrogen source into the processing chamber, forming a plasma in the chamber, and depositing the nitrogen containing amorphous carbon material on the aluminum surface.

In certain embodiments, a showerhead configured to deliver gas to a semiconductor processing chamber is provided. The showerhead comprises an upper surface, a lower surface comprising aluminum, wherein the lower surface has a surface roughness of between about 30 nm and about 50 nm, and a plurality of openings formed between the upper surface and the lower surface.

BRIEF DESCRIPTION OF THE DRAWINGS

A more particular description of the invention, briefly summarized above, may be had by reference to certain embodiments, some of which are illustrated in the appended drawings. It is to be noted, however, that the appended drawings illustrate only certain embodiments and are therefore not to be considered limiting of its scope.

Figure 1:
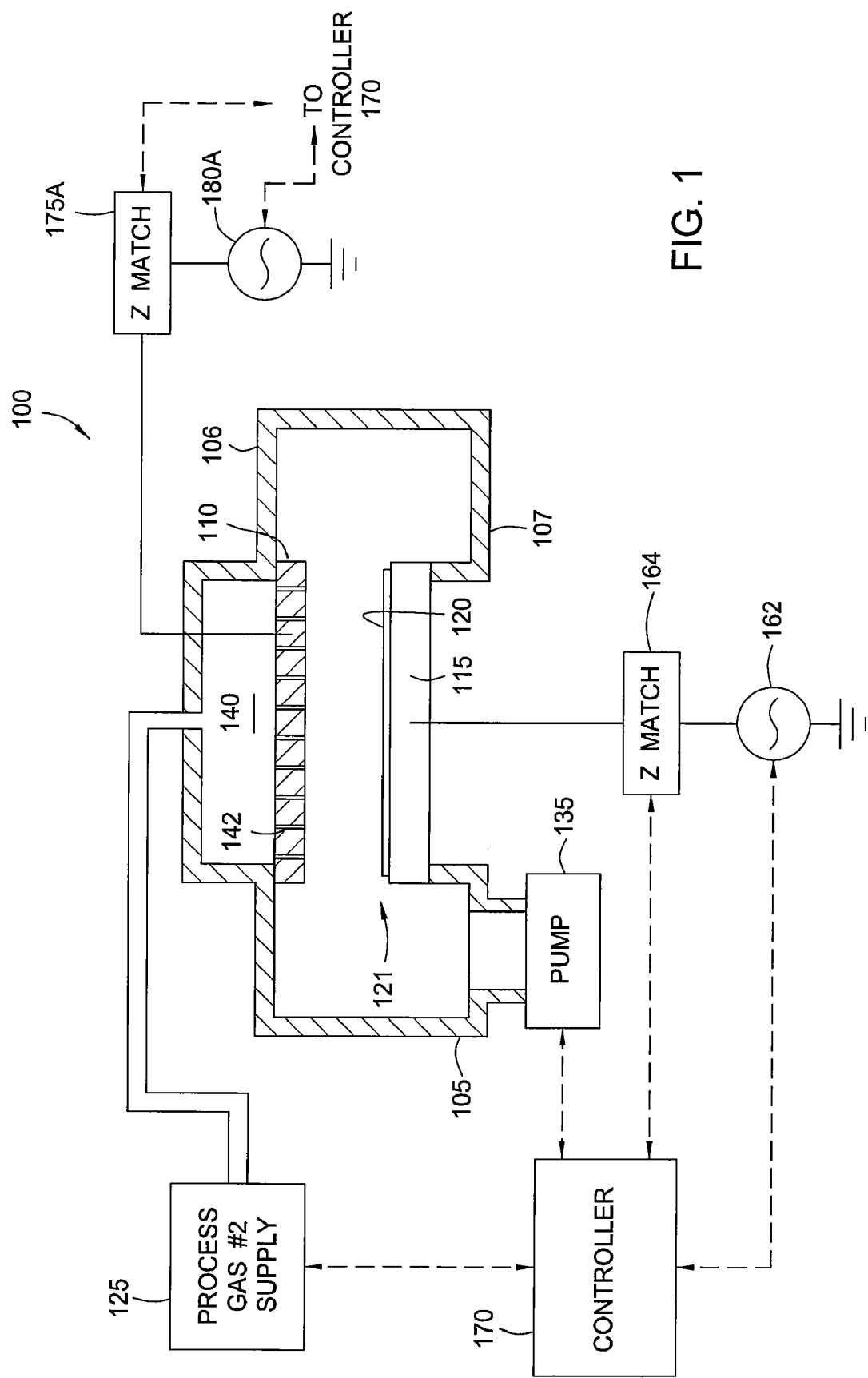
FIG. 1 is a sectional view of a PECVD chamber assembly.

To facilitate understanding, identical reference numerals have been used, wherever possible, to designate identical elements that are common to the figures. It is contemplated that elements and/or process steps of one or more embodiments may be beneficially incorporated in one or more other embodiments without additional recitation.

DETAILED DESCRIPTION

In certain embodiments, a processing system having coated aluminum surfaces that are advantageous for the deposition of amorphous carbon and other films is disclosed.

FIG. 1 is a sectional view of an exemplary PECVD chamber assembly 100. The PECVD chamber may be any plasma enhanced CVD chamber or system including systems such as the CENTURA ULTIMA HDP-CVD™ system, PRODUCER APF PECVD™ system, PRODUCER BLACK DIAMOND™ system, PRODUCER BLOK PECVD™ system, PRODUCER DARC PECVD™ system, PRODUCER HARP™ system, PRODUCER PECVD™ system, PRODUCER STRESS NITRIDE PECVD system, and PRODUCER TEOS FSG PECVD™ system, available from Applied Materials, Inc. of Santa Clara, Calif. An exemplary PRODUCER® system is further described in commonly assigned U.S. Pat. No. 5,855,681, issued Jan. 5, 1999, which is herein incorporated by reference.

Plasma enhanced chemical vapor deposition (PECVD) techniques generally promote excitation and/or disassociation of the reactant gases by the application of an electric field to a reaction zone near the substrate surface, creating a plasma of reactive species immediately above the substrate surface. The reactivity of the species in the plasma reduces the energy required for a chemical reaction to take place, in effect lowering the required temperature for such PECVD processes.

FIG. 1 is a sectional view of a PECVD chamber assembly 100. The chamber assembly 100 has a sidewall 105, a ceiling 106, and a base 107 which enclose a processing region 121. A substrate pedestal 115, which supports a substrate 120, mounts to the base 107 of the chamber assembly 100. A backside gas supply (not shown) furnishes a gas, such as helium, to a gap between the backside of the substrate 120 and the substrate pedestal 115 to improve thermal conduction between the substrate pedestal 115 and the substrate 120. In certain embodiments, the substrate pedestal 115 is heated and/or cooled by use of embedded heat transfer fluid lines (not shown), or an embedded thermoelectric device (not shown), to improve the plasma process results on the substrate 120 surface. A vacuum pump 135 controls the pressure within the process chamber assembly 100, typically holding the pressure below 0.5 milliTorr (mT). A gas distribution showerhead 110 can consist of a gas distribution plenum 140 connected to a gas supply 125 and can communicate with the process region over the substrate 120 through plural gas nozzle openings 142. The showerhead 110, made from a conductive material (e.g., anodized aluminum, etc.), acts as a plasma controlling device by use of a first impedance match element 175A and a first RF power source 180A. A bias RF generator 162 can apply RF bias power to the substrate pedestal 115 and substrate 120 through an impedance match element 164. A controller 170 is adapted to control the impedance match elements (i.e., 175A and 164), the RF power sources (i.e., 180A and 162) and certain other aspects of the plasma process. In certain embodiments dynamic impedance matching is provided to the substrate pedestal 115 and the showerhead 110 by frequency tuning and/or by forward power serving.

In operation, the substrate 120 can be secured to the substrate pedestal 115 by providing a vacuum therebetween. The temperature of the substrate is elevated to a pre-determined process temperature by regulating thermal transfer to the substrate pedestal 115 by, for example, a heating element (not shown). During the deposition process, the substrate is heated to a steady temperature typically between about 200° C. and 700° C.

Gaseous components, which in certain embodiments may include propylene and hydrogen, can be supplied to the process chamber assembly 100 via the gas nozzle openings 142 in showerhead 110. A plasma is formed in the process chamber assembly 100 by applying RF power to a gas source such as argon or nitrogen. The gaseous mixture reacts to form a layer of amorphous carbon, for example Advanced Patterning Film or "APF" available from Applied Materials, Inc. of Santa Clara, Calif., on the surface of the substrate 120.

Figure 2:
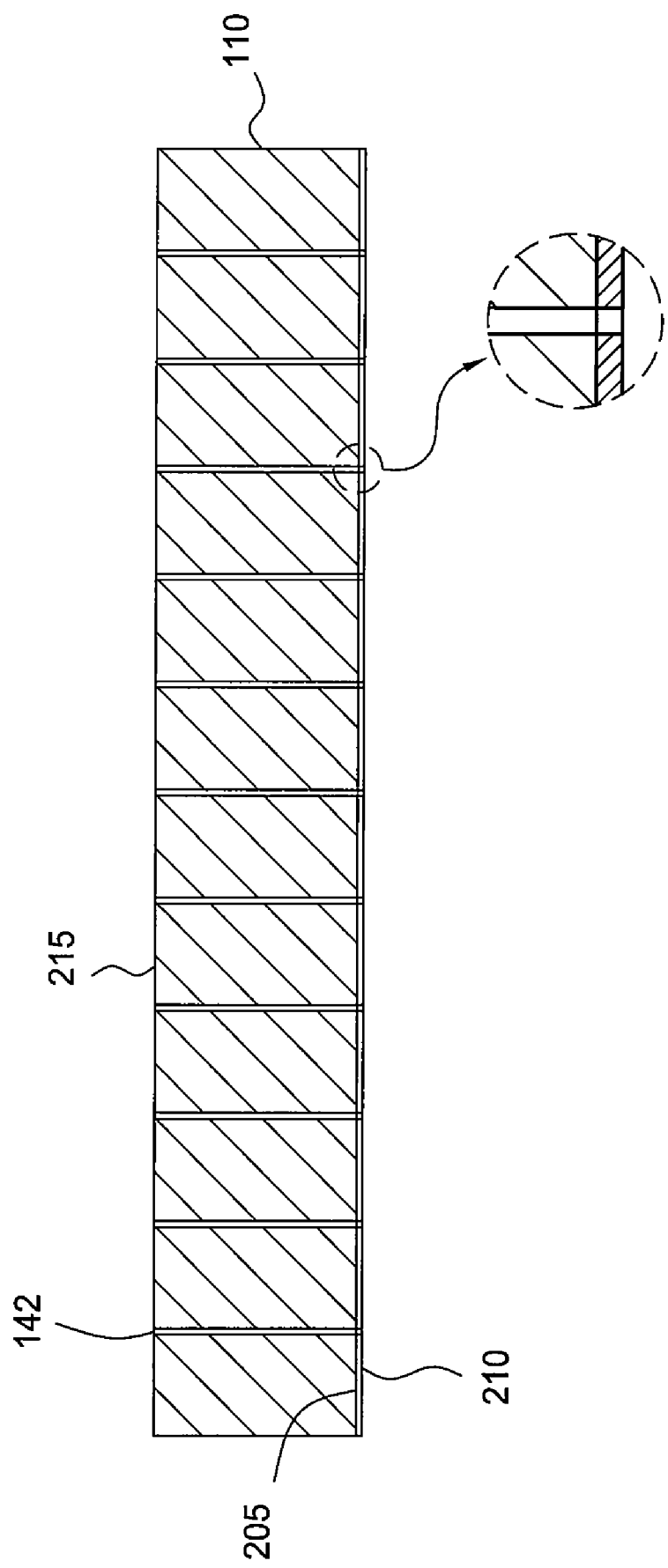
FIG. 2 is a sectional view of a showerhead used in the PECVD chamber assembly of FIG. 1.

FIG. 2 is a sectional view of an exemplary showerhead 110. As shown in FIG. 2, the showerhead can comprise an upper surface 215 and a lower surface 205. A plurality of gas nozzle openings 142 can be formed between the lower surface 205 and the upper surface 215. In certain embodiments, the coating material 210 is disposed on the lower surface 205 of the showerhead 110. The coating material 210 can be applied before final assembly of the process chamber assembly 100. The coating material 210 can also be applied to other parts of the showerhead 110 such as the face plate and the gas distribution plate. In certain embodiments, the coating material 210 can be applied to the showerhead 110 after final assembly of the process chamber assembly 100. Optionally, the coating material 210 can be applied to other aluminum surfaces within the process chamber assembly 100, for example, the chamber 100 itself and the support pedestal 115. In certain embodiments, it may be necessary to periodically reapply the coating material 210 to the showerhead 110 or other aluminum surface. In certain embodiments, aluminum surface is cleaned prior to reapplication of the coating material 210.

In certain embodiments, the coating material 210 comprises a layer of nitrogen containing amorphous carbon or other material that inhibits flaking of carbon residue from the showerhead 110. The thickness of the coating material 210 is sufficient to provide a "sticky" seasoned layer and is typically between about 500 Å and about 3000 Å, such as between about 1000 Å and about 2000 Å, for example about 1500 Å. The coating material 210 functions as an adhesion promoting layer between the bare lower surface 205 of the showerhead 110 and the carbon residues deposited on the showerhead 110 during the amorphous carbon deposition. Thus the coating material 210 adheres to aluminum surfaces as well as amorphous carbon surfaces. Since nitrogen can bond with carbon as well as aluminum surfaces, it can create a "sticky" seasoned layer. In certain embodiments, the seasoned layer can be predominantly carbon which can allow forthcoming amorphous carbon residues to adhere to the showerhead and thereby can inhibit flaking or fall-on particles.

Figure 3:
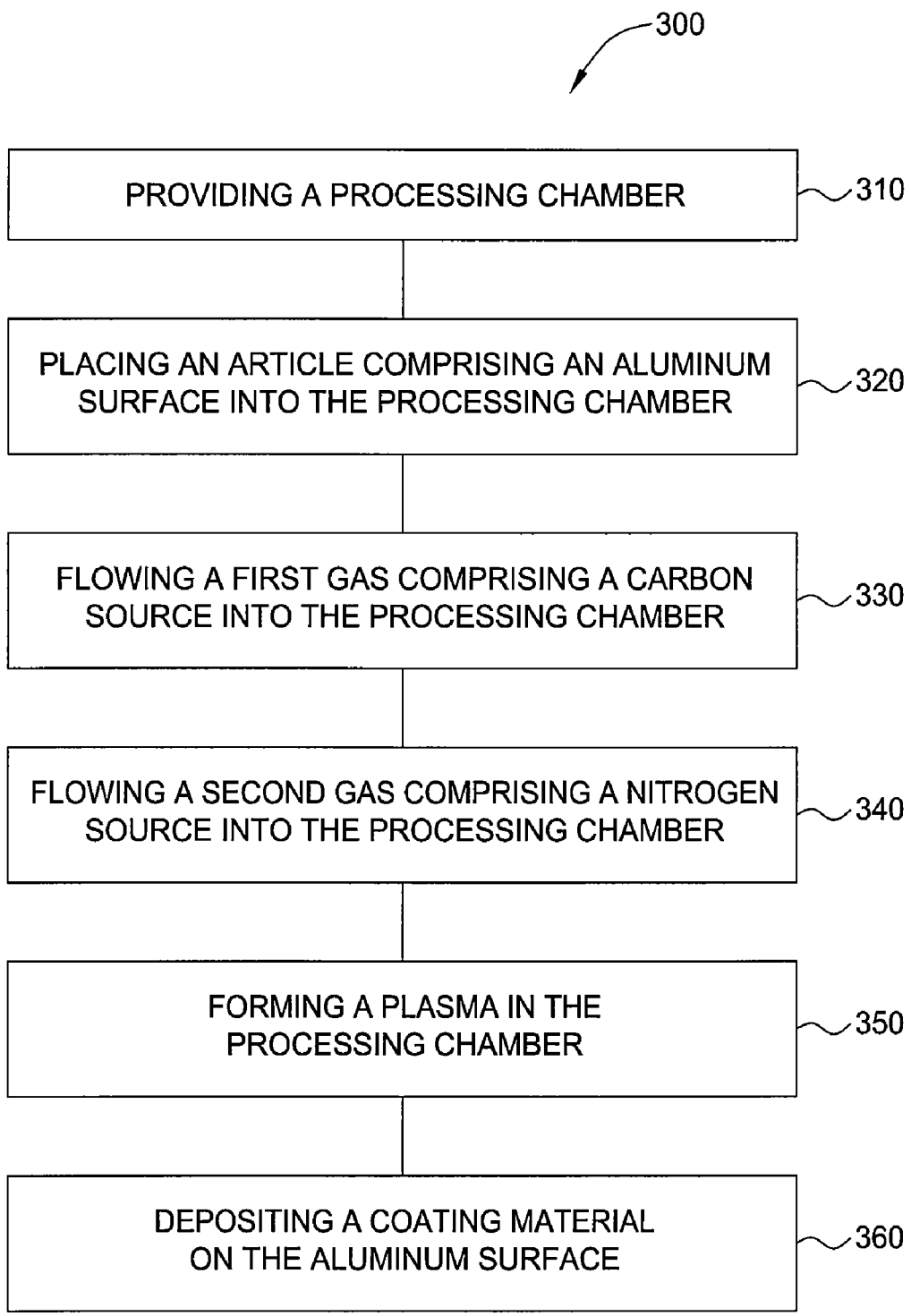
FIG. 3 depicts an exemplary flow diagram of a method of coating an aluminum surface of an article.

FIG. 3 depicts a flow diagram 300 of certain embodiments of a method of coating an aluminum surface of an article. For example, in step 310, a processing chamber is provided. In step 320, the article is placed into the processing chamber. In step 330, a first gas comprising a carbon source is flowed into the processing chamber. In step 340, a second gas comprising a nitrogen source is flowed into the processing chamber. In step 350, a plasma is formed in the chamber. In step 360, a coating material is deposited on the aluminum surface.

Typical carbon sources include hydrocarbon compounds with the general formula $C_xH_y$, where x has a range of between 2 and 10 and y has a range of between 2 and 22. For example, propylene ($C_3H_6$), propyne ($C_3H_4$), propane ($C_3H_8$), butane ($C_4H_{10}$), butylene ($C_4H_8$), butadiene ($C_4H_6$), acetelyne ($C_2H_2$), pentane, pentene, pentadiene, cyclopentane, cyclopentadiene, benzene, toluene, alpha terpinene, phenol, cymene, norbornadiene, as well as combinations thereof, may be used as the hydrocarbon compound. Liquid precursors may be used to deposit amorphous carbon films. The use of liquid precursors in the deposition of amorphous carbon films is further discussed in United States Patent Application Publication No. 2005/0287771, published Dec. 29, 2005, entitled LIQUID PRECURSORS FOR THE CVD DEPOSITION OF AMORPHOUS CARBON FILMS, which is herein incorporated by reference to the extent it does not conflict with the current specification. These liquid precursors include, but are not limited to, toluene, alpha terpinene (A-TRP), and norbornadiene (BCHD).

Similarly, a variety of gases such as hydrogen ($H_2$), nitrogen ($N_2$), ammonia ($NH_3$), or combinations thereof, among others, can be added to the gas mixture, if desired. Argon (Ar), helium (He), and nitrogen ($N_2$) can be used to control the density and deposition rate of the amorphous carbon layer.

The carbon source compound may be introduced into the chamber at a flow rate of between about 200 sccm and about 2,000 sccm, such as between about 1,500 sccm and about 2,000 sccm, for example, 700 sccm. The nitrogen source may be introduced into the chamber at a flow rate of between about 100 sccm and about 15,000 sccm, such as between about 5,000 sccm and about 10,000 sccm, for example, 8,000 sccm. Optionally, a carrier gas can be introduced into the chamber at a flow rate of between about 0 sccm and about 20,000 sccm. The carrier gas may be nitrogen gas or an inert gas. In certain embodiments, the flow rates are chosen such that the coating material is predominately carbon. For example, the carbon source compound may be introduced into the chamber at a first flow rate, and the nitrogen source compound may be introduced into the chamber at a second flow rate such that the ratio of the second flow rate to the first flow rate is between about 50:1 and about 1:1, such as between about 10:1 and about 1:1, for example, about 7:1. In certain embodiments, the carbon source compound is propylene and the nitrogen source is nitrogen.

In certain embodiments, during deposition of the nitrogen containing amorphous carbon layer, the substrate can be typically maintained at a temperature between about 200° C. and about 700° C., preferably between about 250° C. and about 350° C., such as about 300° C. In certain embodiments, a RF power level of between about 20 W and about 1,600 W, for example, about 1,000 W, for a 300 mm substrate is typically used in the chamber. The RF power can be provided at a frequency between about 0.01 MHz and 300 MHz, for example, 13.56 MHz. In certain embodiments, the RF power can be provided to a gas distribution assembly or "showerhead" electrode in the chamber. In certain embodiments, the RF power may be applied to a substrate support in the chamber. In certain embodiments, the RF power may be provided at a mixed frequency, such as at a high frequency of about 13.56 MHz and a low frequency of about 350 kHz. The RF power may be cycled or pulsed and continuous or discontinuous.

In certain embodiments, the spacing between the showerhead and support pedestal during the deposition of the nitrogen containing amorphous carbon layer may be between about 280 mils and about 1,500 mils, for example, 400 mils, and the pressure in the chamber may be between about 1 Torr and about 10 Torr, for example, 7 Torr.

Figure 4:
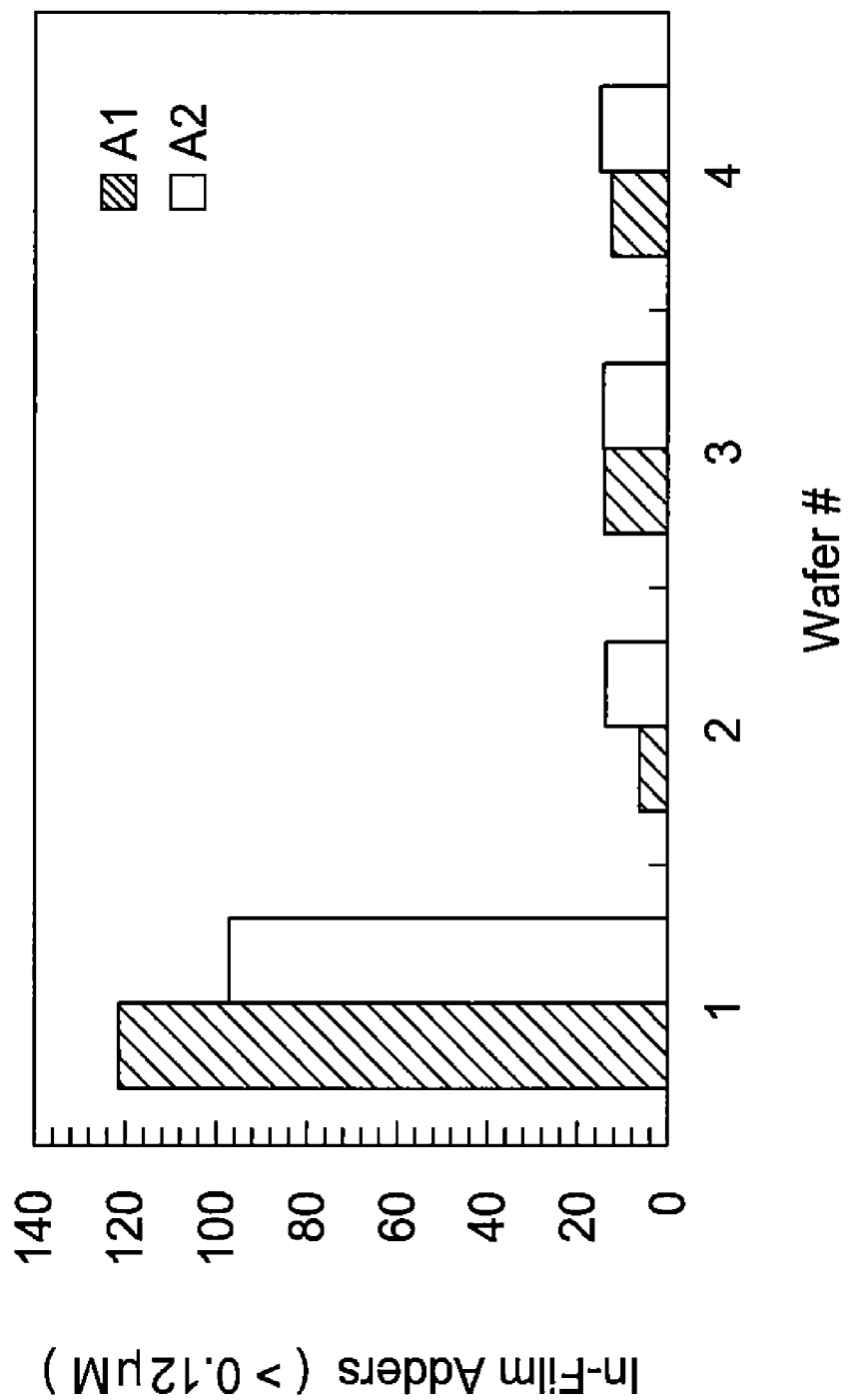
FIG. 4 is a graph demonstrating the effect of an exemplary coating material on in-film particle performance of 10 kÅ thick Low k amorphous carbon layer.

FIG. 4 is a graph demonstrating the effect of certain embodiments of the coating material on in-film particle performance of 10 kÅ thick Low k amorphous carbon. FIG. 4 shows the effect of a nitrogen amorphous carbon layer of approximately 1,500 Å thick deposited on the showerhead prior to the bulk Low k amorphous carbon deposition. The exemplary coating material was deposited using the following conditions: a substrate temperature of 300° C., a chamber pressure of 7 Torr, a spacing of 400 mils, a nitrogen flow rate of 8,000 sccm, a propylene flow rate of 700 sccm, a RF power level of 1,000 W, and a deposition rate of 2,100 Å/min. These conditions produced a nitrogen containing amorphous carbon layer with a refractive index of 1.69, a light absorption coefficient of 0.02, and a stress of −80 MPa.

Still referring to FIG. 4, the exemplary Low k amorphous carbon layer was deposited on wafer 1 without the benefit of the nitrogen containing amorphous carbon layer. The exemplary Low k amorphous layer was deposited on wafers 2-4 with the benefit of the nitrogen containing amorphous carbon layer. The results show a significant reduction in in-film adders or contaminants, represented by A1 and A2, for the exemplary Low k amorphous carbon layers deposited on wafers 2-4.

Figure 5A:
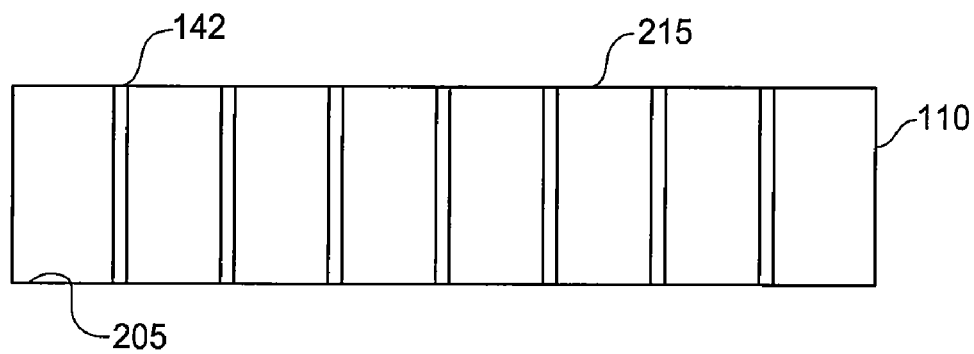
FIG. 5A is a sectional view of a showerhead before the showerhead is treated to increase surface roughness.
Figure 5B:
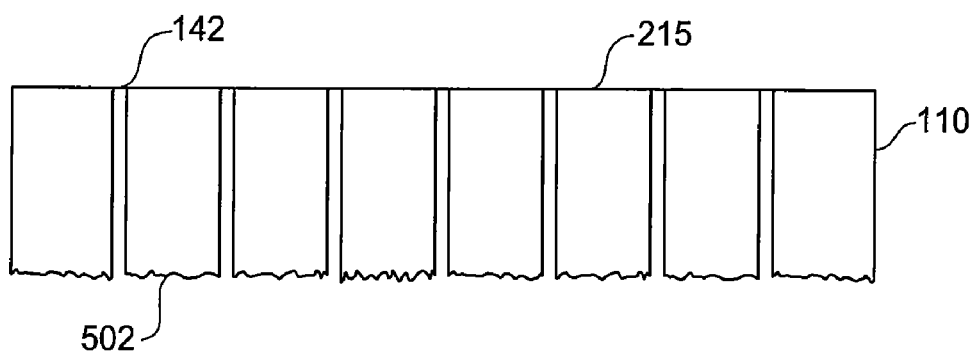
FIG. 5B is a sectional view of a showerhead with a roughened surface.

In certain embodiments a method for improving the adhesion strength of the lower surface 205 of the showerhead 110 is provided. FIG. 5A is a sectional view of the showerhead 110 before the showerhead 110 is treated to increase surface roughness. The showerhead 110 can comprise an upper surface 215 and a lower surface 205. A plurality of gas nozzle openings 142 can be formed between the lower surface 205 and the upper surface 215. In certain embodiments, this method increases the surface roughness of the lower surface 205 of the showerhead 110. In certain embodiments, this method may also be used to increase the surface roughness of other parts of the chamber 100. For example, in certain embodiments this method increases the root mean square ("RMS") roughness of the lower surface 205 of the showerhead 110 from about 20 nm to between about 30 nm and about 50 nm, for example, about 40 nm. FIG. 5B is a sectional view of the showerhead 110 with a roughened surface 502. Roughening of the lower surface 205 to produce roughened surface 502 may be performed by a variety of methods known to those of skill in the art. For example, two such methods of roughening can be achieved by physically bombarding the showerhead with small metallic balls, also known as a "bead blasting process," and/or application of various chemical treatments known in the art.

Figure 5C:
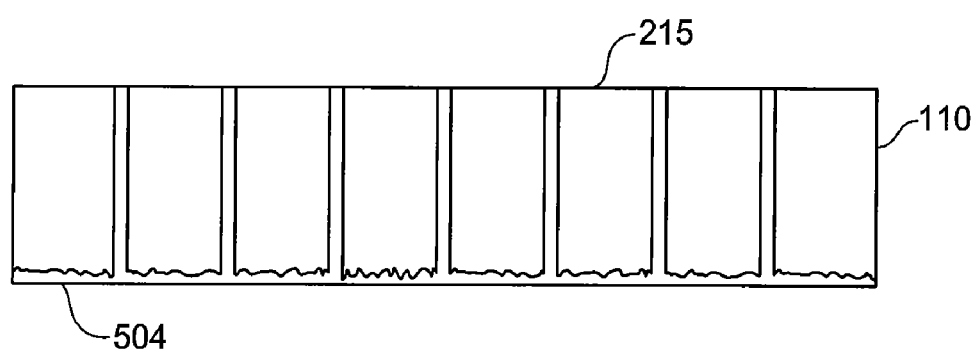
FIG. 5C is a sectional view of a showerhead with carbon residue attached to the roughened surface.

FIG. 5C is a sectional view of a showerhead with carbon residue 504 securely attached to the roughened surface 502. In certain embodiments, the "bead blasting process" can provide a textured and roughened surface 502 that enhances the adherence of carbon residue 504 to the roughened surface 502 of the showerhead 110. In bead blasting, beads are propelled toward the surface by air at a pressure that is suitably high to roughen the surface. The beads may comprise a material having a hardness higher than that of the underlying structure to allow the beads to erode and roughen the lower surface 205 of the showerhead 110 to form a roughened surface 502. Suitable bead materials include for example, aluminum oxide, glass, silica, or hard plastic. In certain embodiments, the beads comprise a grit of aluminum oxide having a mesh size selected to suitably grit blast the surface, such as for example, a grit of alumina particles having a mesh size of about 200. The bead blasting may take place in, for example, a bead blaster, comprising an enclosed housing.

Figure 6:
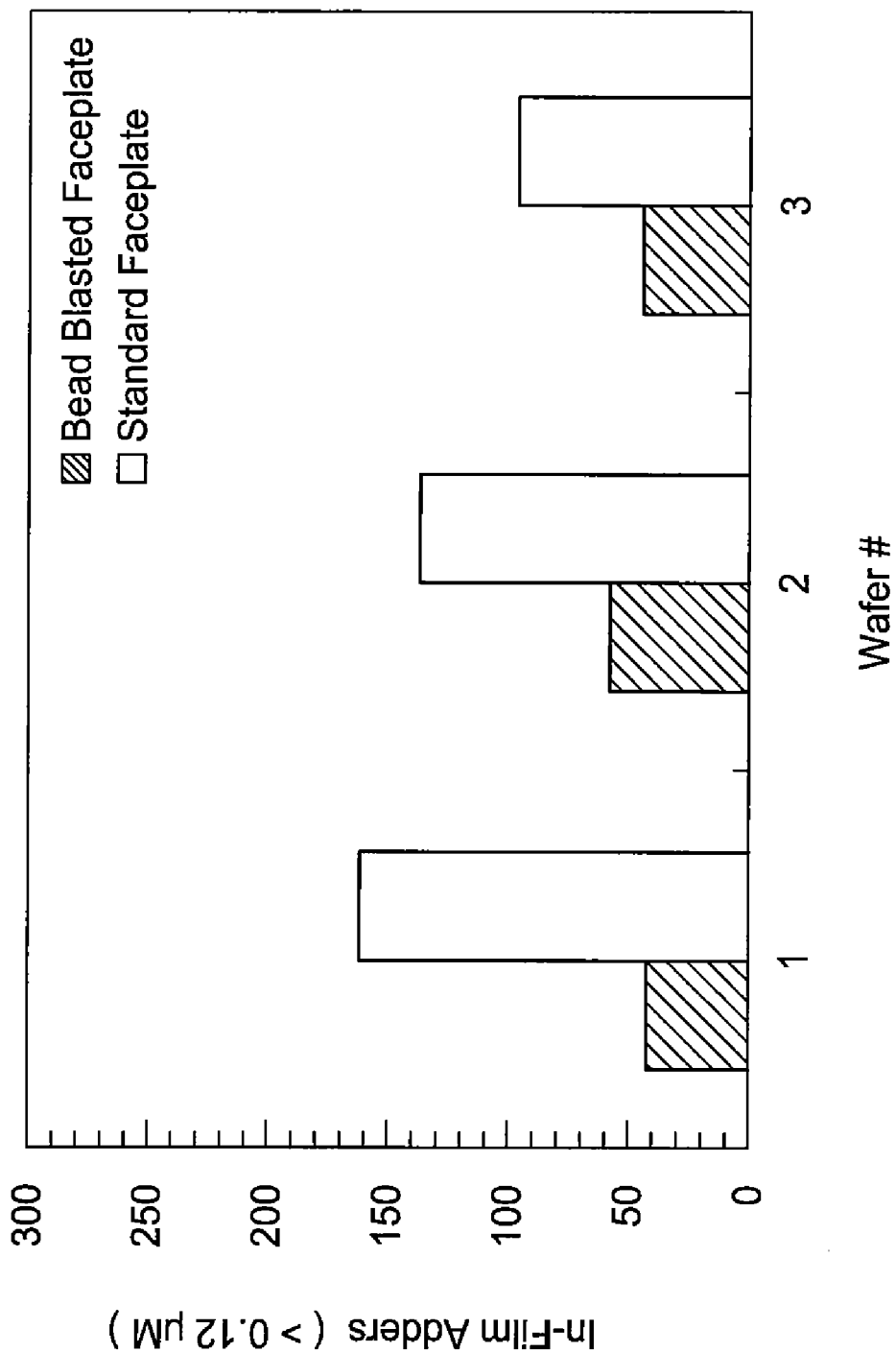
FIG. 6 illustrates a graph demonstrating the effect of faceplate roughness on the in-film particle performance of 10 kÅ thick Low k amorphous carbon layer.

In certain embodiments, FIG. 6 illustrates a graph demonstrating the effect of faceplate roughness on the in-film particle performance of 10 kÅ thick Low k amorphous carbon layer. For example, FIG. 6 compares the in-film adders for a 10 kÅ thick Low k amorphous carbon layer deposited in a chamber containing an exemplary bead-blasted faceplate versus a standard faceplate. In certain embodiments, the exemplary bead-blasted faceplate can have a roughness of 40 nm where the standard faceplate has a roughness of 10 nm. For example the results show a significant reduction of in-film adders/contaminants for 10 kÅ thick Low k amorphous carbon deposited in a chamber containing an exemplary bead-blasted faceplate with a roughness of 40 nm versus a chamber containing a standard faceplate with a roughness of 10 nm. These results demonstrate that an increase in the surface roughness of the showerhead increases the adhesion strength between the showerhead and carbon residues thus reducing the presence of in-film adders in the deposited Low k amorphous carbon layer.

In certain embodiments, a method of reducing the presence of in-film adders is provided. The method comprises the addition of $H_2$ as a dilution gas during the bulk deposition process. In certain embodiments, this method may be used with deposition processes described in commonly assigned United States Patent Application Publication No. 2005/0287771, published Dec. 29, 2005, entitled LIQUID PRECURSORS FOR THE CVD DEPOSITION OF AMORPHOUS CARBON FILMS and U.S. patent application Ser. No. 11/427,324, filed Jun. 28, 2006, entitled METHOD FOR DEPOSITING AN AMORPHOUS CARBON FILM WITH IMPROVED DENSITY AND STEP COVERAGE which are herein incorporated by reference to the extent they do not conflict with the current specification. In certain embodiments, the addition of $H_2$ has been shown to significantly reduce the in-film particles. It is believed that several mechanisms play a role in this phenomenon. For example, hydrogen species can passivate the gas phase CHx species, thereby limiting the growth of these radicals into potential particle nuclei. Additionally, for example, the addition of $H_2$ may lead to a widening of the plasma sheath at the electrode surfaces, thus leading to a reduction in the momentum of the ions bombarding the electrodes.

Figure 7:
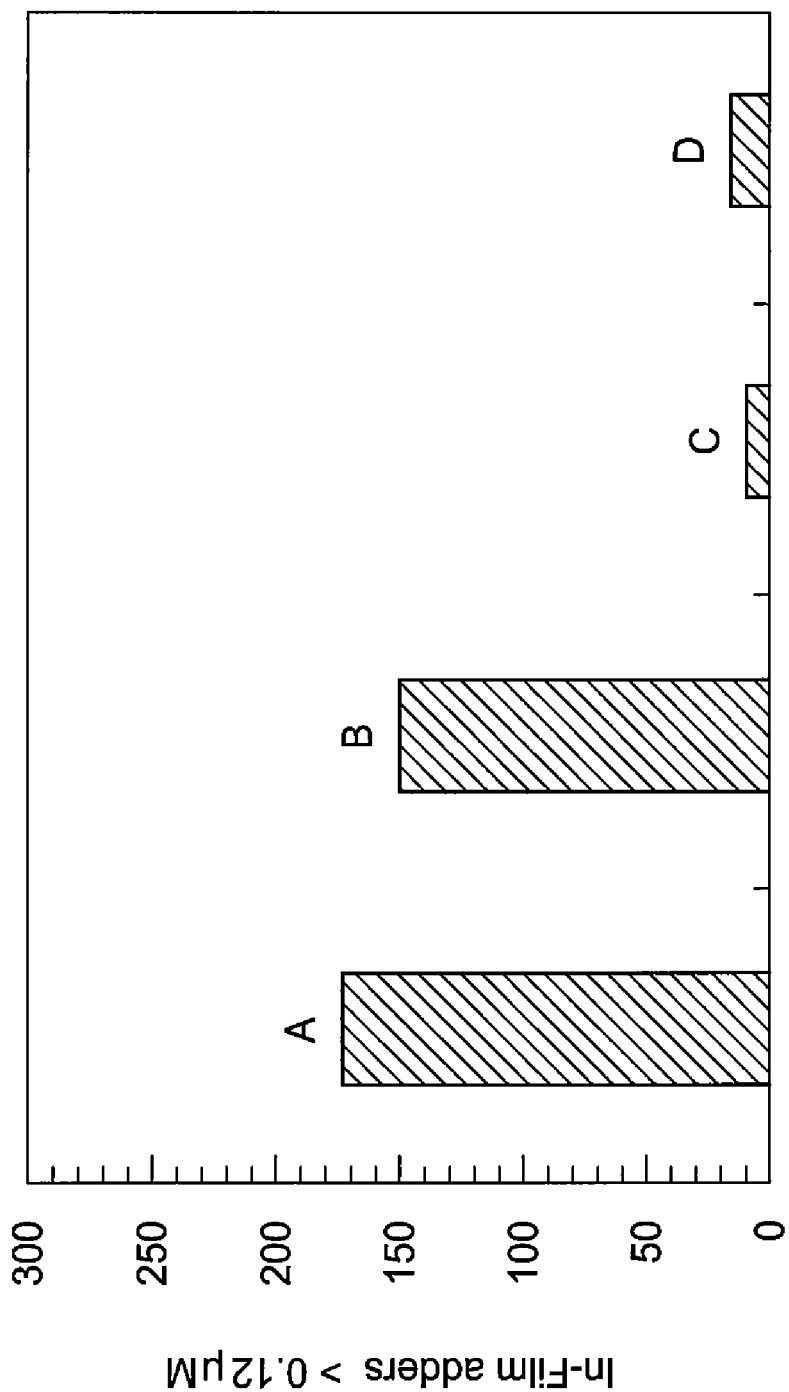
FIG. 7 illustrates a graph demonstrating the effect of $H_2$ dilution on the in-film particle performance of 10 kÅ thick Low k amorphous carbon layer.

In certain embodiments, FIG. 7 illustrates a graph demonstrating the effect of $H_2$ dilution on the in-film particle performance of an exemplary 10 kÅ thick Low k amorphous carbon layer. Deposition for the first sample, represented by "A," was performed with an exemplary argon flow rate of 8,000 sccm and an exemplary helium flow rate of 400 sccm. Deposition for the second sample, represented by "B," was performed with an exemplary argon flow rate of 7,000 sccm and an exemplary hydrogen flow rate of 1,000 sccm. Deposition for the third sample, represented by "C," was performed with an exemplary argon flow rate of 5,000 sccm and an exemplary hydrogen flow rate of 2,000 sccm. Deposition for the fourth sample, represented by "D," was performed with an exemplary argon flow rate of 5000 sccm and an exemplary hydrogen flow rate of 3,000 sccm. The results show that an increase in the addition of $H_2$ as a dilution gas can yield a decrease in in-film adders.

While the foregoing is directed to certain embodiments of the present invention, other and further embodiments of the invention may be devised without departing from the basic scope thereof, and the scope thereof is determined by the claims that follow.

The invention claimed is:

1. A showerhead having an aluminum surface coated with a nitrogen containing amorphous carbon layer, the nitrogen containing amorphous carbon layer applied by a method comprising:
   placing the showerhead into a processing chamber;
   flowing a first gas comprising a carbon source into the processing chamber;
   flowing a second gas comprising a nitrogen source into the processing chamber;
   forming a plasma in the chamber; and
   depositing the nitrogen containing amorphous carbon layer on the aluminum surface, wherein the first gas has a flow rate between about 200 sccm and about 2000 sccm.

2. A showerhead having an aluminum surface coated with a nitrogen containing amorphous carbon layer, the nitrogen containing amorphous carbon layer applied by a method comprising:
   placing the showerhead into a processing chamber;
   flowing a first gas comprising a carbon source into the processing chamber;
   flowing a second gas comprising a nitrogen source into the processing chamber;
   forming a plasma in the chamber; and
   depositing the nitrogen containing amorphous carbon layer on the aluminum surface, wherein the second gas has a flow rate between about 100 sccm and about 15000 sccm.

3. A showerhead having an aluminum surface coated with a nitrogen containing amorphous carbon layer, the nitrogen containing amorphous carbon layer applied by a method comprising:
   placing the showerhead into a processing chamber;
   flowing a first gas comprising a carbon source into the processing chamber;
   flowing a second gas comprising a nitrogen source into the processing chamber;
   forming a plasma in the chamber; and
   depositing the nitrogen containing amorphous carbon layer on the aluminum surface, wherein the forming a plasma in the chamber comprises applying a RF power to an inert gas, wherein the RF power frequency is between about 0.01 MHz and 300 MHz.

4. The showerhead of claim 3, wherein the inert gas is selected from a group comprising helium, neon, argon, krypton, xenon, radon, and nitrogen.

5. The showerhead of claim 3, wherein the inert gas has a flow rate between about 700 sccm and 7000 sccm.

6. A showerhead having an aluminum surface coated with a nitrogen containing amorphous carbon layer, the nitrogen containing amorphous carbon layer applied by a method comprising:

placing the showerhead into a processing chamber;

flowing a first gas comprising a carbon source into the processing chamber;

flowing a second gas comprising a nitrogen source into the processing chamber;

forming a plasma in the chamber; and depositing the nitrogen containing amorphous carbon layer on the aluminum surface, wherein the nitrogen containing amorphous carbon layer has a thickness between about 500 Å and about 3000 Å.

7. A showerhead having an aluminum surface coated with a nitrogen containing amorphous carbon layer, the nitrogen containing amorphous carbon layer applied by a method comprising:

placing the showerhead into a processing chamber;

flowing a first gas comprising a carbon source into the processing chamber;

flowing a second gas comprising a nitrogen source into the processing chamber;

forming a plasma in the chamber; and depositing the nitrogen containing amorphous carbon layer on the aluminum surface, wherein the nitrogen containing amorphous carbon layer is deposited on the showerhead before coupling the showerhead to a processing chamber.

8. A showerhead having an aluminum surface coated with a nitrogen containing amorphous carbon layer, the nitrogen containing amorphous carbon layer applied by a method comprising:

placing the showerhead into a processing chamber;

flowing a first gas comprising a carbon source into the processing chamber;

flowing a second gas comprising a nitrogen source into the processing chamber;

forming a plasma in the chamber; and depositing the nitrogen containing amorphous carbon layer on the aluminum surface, wherein placing the showerhead into a processing chamber comprises attaching the showerhead to the processing chamber.

* * * * *